US005708598A

United States Patent [19]

Saito

[11] Patent Number: 5,708,598
[45] Date of Patent: Jan. 13, 1998

[54] SYSTEM AND METHOD FOR READING MULTIPLE VOLTAGE LEVEL MEMORIES

[76] Inventor: Tamio Saito, 1013 Salt Ct., Redwood Shores, Calif. 94065

[21] Appl. No.: 597,515

[22] Filed: Jun. 6, 1996

Related U.S. Application Data

[63] Continuation of Ser. No. 428,781, Apr. 24, 1995, abandoned.
[51] Int. Cl.$^6$ ..................................................... G11C 7/00
[52] U.S. Cl. ...................... 365/149; 365/210; 365/187; 365/174; 365/189.01; 365/204; 365/202
[58] Field of Search ........................ 365/149, 210, 365/187, 174, 189.01, 204, 202, 185.03, 189.07

[56] References Cited

U.S. PATENT DOCUMENTS

| | | | |
|---|---|---|---|
| 4,156,286 | 5/1979 | Connors et al. | 365/45 |
| 4,368,523 | 1/1983 | Kawate | 365/63 |
| 4,441,169 | 4/1984 | Sasaki et al. | 365/190 |
| 4,447,892 | 5/1984 | Zibu | 365/156 |
| 4,661,929 | 4/1987 | Aoki et al. | 365/189 |
| 4,872,142 | 10/1989 | Hannai | 365/189.07 |
| 5,043,940 | 8/1991 | Harari | 365/168 |
| 5,184,324 | 2/1993 | Ohta | 365/149 |
| 5,353,251 | 10/1994 | Uratani et al. | 365/189.05 |
| 5,418,739 | 5/1995 | Takasugi | 365/149 |
| 5,459,686 | 10/1995 | Saito | 365/149 |

FOREIGN PATENT DOCUMENTS

| | | |
|---|---|---|
| 60-239994 | 11/1985 | Japan . |
| 62-2650 | 1/1987 | Japan . |
| 63-195896 | 8/1988 | Japan . |
| 63-195897 | 8/1988 | Japan . |
| 1-192083 | 8/1989 | Japan . |

*Primary Examiner*—David C. Nelms
*Assistant Examiner*—Vu A. Le
*Attorney, Agent, or Firm*—Fenwick & West LLP

[57] ABSTRACT

A system and method for reading multi-bit memory cells. The invention resides in employing a plurality of comparators to compare the voltage contained in a multi-bit memory cell with a reference voltage, where each comparator is associated with a single pair of bit lines. For each pair of bit lines, a first bit line is coupled to a multi-bit memory cell and a second bit line is coupled to a dummy cell containing a reference voltage. The first bit line is also coupled to a data bus. The data bus is configured to connect the first bit line to a first input of each of a plurality of comparators that are associated with other bit lines and memory cells. Each comparator has a unique reference voltage applied to its second input. Each comparator compares the voltage on the first bit line with the applied reference voltage and outputs the result of this comparison to a controller. The controller repeatedly instructs a voltage source to alter the voltage levels applied to the second input of each comparator until the controller can determine the values of the data bits represented by the voltage stored in the multi-bit memory cell.

16 Claims, 8 Drawing Sheets

| VOLTAGE | DATA |
| --- | --- |
| 3.75 | 1111 |
| 3.50 | 1110 |
| 3.25 | 1101 |
| 3.00 | 1100 |
| 2.75 | 1011 |
| 2.50 | 1010 |
| 2.25 | 1001 |
| 2.00 | 1000 |
| 1.75 | 0111 |
| 1.50 | 0110 |
| 1.25 | 0101 |
| 1.00 | 0100 |
| 0.75 | 0011 |
| 0.50 | 0010 |
| 0.25 | 0001 |
| 0.00 | 0000 |

*FIGURE 8*

SYSTEM AND METHOD FOR READING MULTIPLE VOLTAGE LEVEL MEMORIES

This is a continuation of application Ser. No. 08/428,781 filed on Apr. 24, 1995 now abandoned.

BACKGROUND OF THE INVENTION

1. Field of the Invention

This invention relates generally to semiconductor memories having multi-bit memory cells, and more particularly to a system and method for improving the speed and cost of reading multi-bit memory cells.

2. Description of Background Art

As computers have grown in complexity, the demand for more memory has grown. This in turn has led to a greater demand for higher density memories (memories capable of storing more bits of information in the same semiconductor surface area). In an attempt to increase the storage density of memories, the concept of a multi-bit memory cell was developed. More specifically, it was envisioned that if each memory cell were able to store more than one bit of data, then the storage density of the memory would be increased. Consequently, efforts have been made in recent years to develop memories using multi-bit memory cells. Most of the multi-bit memory cell work has been done in connection with dynamic random access memory (DRAM) memory cells.

In general, a multi-bit DRAM cell has the same construction as a single-bit DRAM cell, consisting of a storage capacitor and a cell gate. The difference between the multi-bit cell and the single-bit cell is manifested in the way the cells are used. To illustrate how a single memory cell can be used to store a plurality of bits of data, suppose that it is desirable to store two bits of data in a memory cell, and that the voltages to be stored in the memory cell range from 0 to 4 volts. In order to use the memory cell as a two-bit memory cell, the voltage range is first divided into four distinct voltage sub-ranges: (1) 0 to 1 volt; (2) 1 to 2 volts; (3) 2 to 3 volts; and (4) 3 to 4 volts. Each voltage sub-range represents a certain combination of two data bits. For example, the first sub-range can represent the data bits "00", the second sub-range can represent the data bits "01", the third sub-range can represent the data bits "10", and the fourth sub-range can represent the data bits "11". Once the voltage range is subdivided in this manner, two-bit data can be stored in the memory cell by applying and storing an appropriate voltage in the cell. For example, the data bits "10" can be stored in the memory cell by storing a voltage between 2 and 3 volts in the memory cell. Likewise, the data bits "11" can be stored in the memory cell by storing a voltage between 3 and 4 volts in the memory cell. Thus, by dividing the full voltage range into voltage sub-ranges, and then storing appropriate voltage levels in the memory cell, a single-bit memory cell can be converted into a multi-bit memory cell. This same concept can be extended to store three or more data bits per cell. In general, to store an n number of bits in a single cell, $2^n$ distinct voltage sub-ranges will need to be created.

Storing data in a multi-bit memory cell is only one part of creating a practicable multi-bit memory. The other important consideration is that of reading data from the cells. In the prior art, two different reading methodologies have been implemented. According to a first reading methodology, commonly known as the serial A/D conversion method, data is read from a multi-bit memory cell by repeatedly comparing the voltage stored in the memory cell with a stepped reference voltage. More specifically, with each clock cycle, the reference voltage is increased by a certain step and then compared with the voltage stored in the memory cell. By comparing the stored voltage with all of the possible voltages which could be stored in the cell, the data stored in the cell is ascertained. This method is advantageous in that it requires little additional circuitry. However, it has proven to be quite slow. In general, to read n-bits of data from a cell, $2^n$ clock cycles are required. For cells which store a relatively large number of bits (four bits, for example), this reading method is too slow to be practicable.

Another reading method which has been implemented in the prior art is commonly known as the flash A/D conversion method. According to this method, each cell is connected to $2^n$ comparators, where n is the number of data bits stored in the cell. Each comparator has one input connected to the output of the cell, and another input connected to a reference voltage. Each of the comparators is connected to a different reference voltage. Data is read from the cell by outputting the voltage stored in the cell to the comparators, and allowing the comparators to compare, simultaneously, the stored voltage to each of the different reference voltages. By so doing, the voltage, and hence, the data stored in the cell is ascertained in a single clock cycle. While this method is significantly faster than the serial conversion method, it has a significant drawback in that it requires a large number of wire connections and a large number of comparators. More specifically, in order implement the flash conversion method, there needs to be $2^n$ wire connections for each cell to connect each cell to $2^n$ comparators. These connections and comparators consume a very significant amount of surface area on a memory chip. For a memory having a large number of cells, the additional connections and comparators would consume the surface area saved by having multi-bit cells. Thus, a multi-bit memory using the flash conversion method would not provide increased storage density. As shown by this discussion, the reading methodologies of the prior art fail to provide satisfactory results.

What is needed is a system and method for reading multi-bit memory cells which would permit faster reading times but which does not require an overly burdensome amount of additional circuitry.

SUMMARY OF THE INVENTION

The invention is a system and method for reading multi-bit memory cells. The invention resides in employing a plurality of comparators to compare the voltage contained in a multi-bit memory cell with a reference voltage, where each comparator is associated with a single pair of bit lines. For each pair of bit lines, a first bit line is coupled to a multi-bit memory cell and a second bit line is coupled to a dummy cell containing a reference voltage. The first bit line is also coupled to a data bus. The data bus is configured to connect the first bit line to a first input of each of a plurality of comparators that are associated with other bit lines and memory cells. Each comparator has a unique reference voltage applied to its second input. Each comparator compares the voltage on the first bit line with the applied reference voltage and outputs the result of this comparison to a controller. The controller repeatedly instructs a voltage source to alter the voltage levels applied to the second input of each comparator until the controller can determine the values of the data bits represented by the voltage stored in the multi-bit memory cell.

BRIEF DESCRIPTION OF THE DRAWINGS

FIG. 8 is a table representing the voltage sub-ranges of a multi-bit memory cell representing four data bits.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used.

Figure 1:
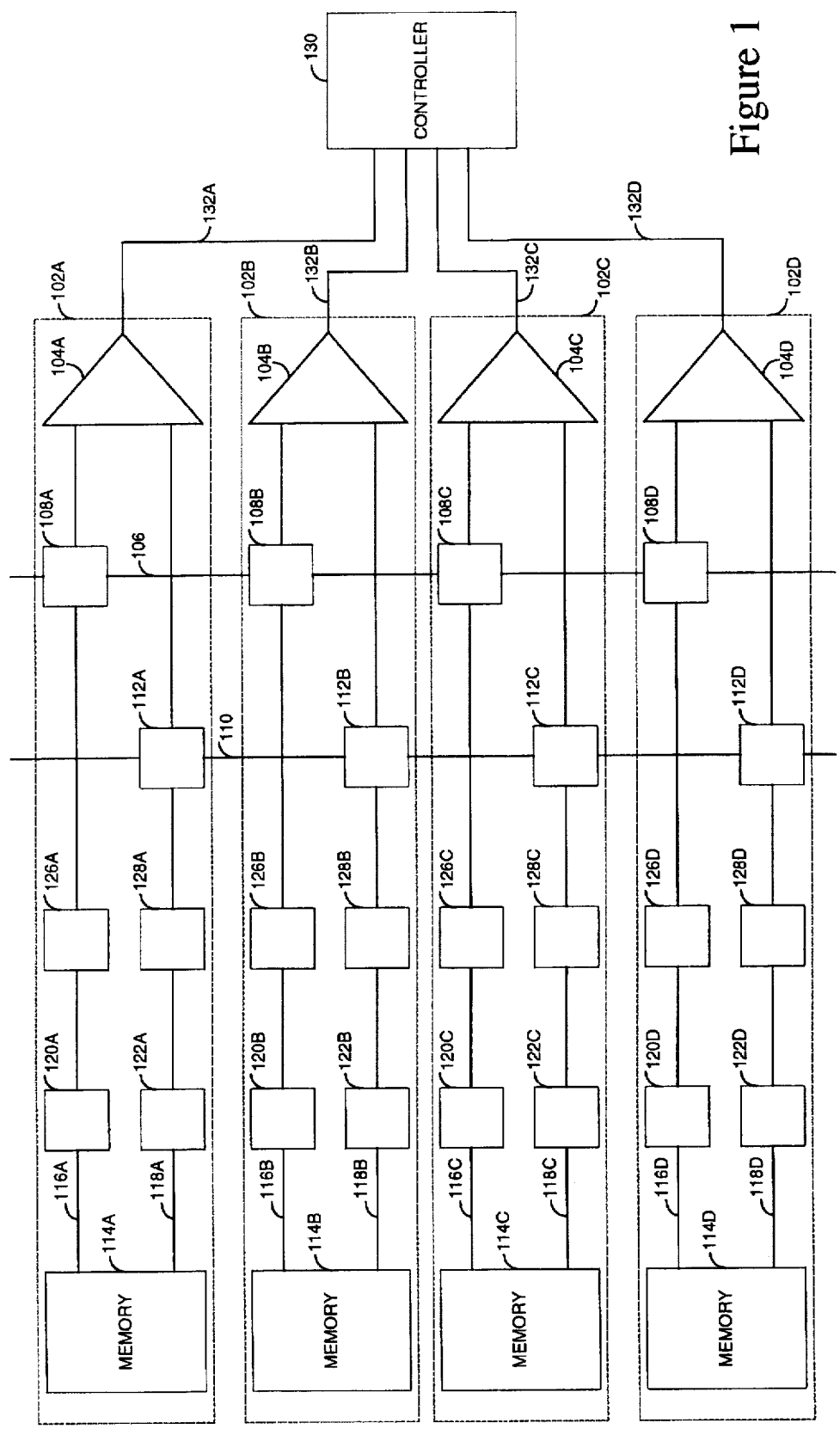
FIG. 1 is an illustration of a multi-bit memory system according to the preferred embodiment.

With reference to FIG. 1, there is shown a multi-bit memory system according to the preferred embodiment of the present invention. A plurality of memory portions 102 are connected via data bus A 106 and data bus B 108. In FIG. 1, four memory portions 102 are illustrated. However, any number of memory portions 102 can be connected together via the two data busses 106, 108. The output 132 of each memory portion 102 is coupled to a controller 130. The controller 130 can be formed using hardware or software. The functions performed by the controller 130 is described in greater detail below. Each memory portion 102 includes a memory unit 114, two data bit lines 116, 118, two read gates 120, 122, two capacitance gates 126, 128, two bus switches 108, 112, and a comparator 104.

Figure 2:
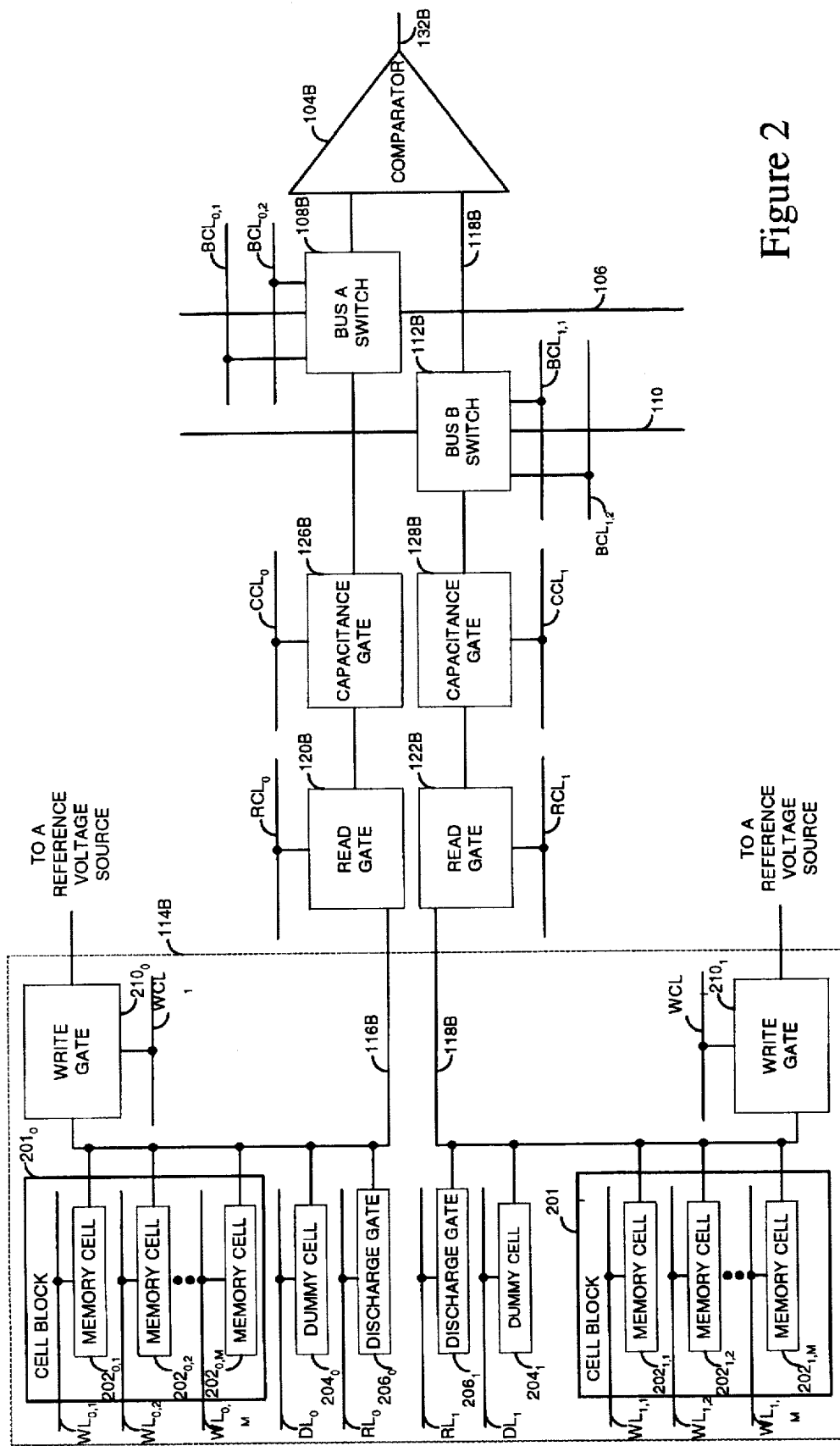
FIG. 2 is a more detailed illustration of the memory portion of the preferred embodiment.

FIG. 2 is a more detailed illustration of a memory portion, e.g., 102B. Memory portion 102B includes a pair of complementary cell blocks $201_0$, $201_1$, each cell block having an arbitrary number, "m", of memory cells 202 therein. Specifically, cell block $201_0$, includes memory cells $202_{0,1}$ to $202_{0,m}$ while cell block $201_1$ includes memory cells $202_{1,1}$ to $202_{1,m}$. Also, each cell block $201_0$, $201_1$ preferably has a bit line associated therewith. As shown in FIG. 2, bit line $BL_0$ is associated with cell block $201_0$, while bit line $BL_1$ is associated with cell block $201_1$. As will be explained later, these bit lines $BL_0$, $BL_1$ will be used to read data from the memory cells 202.

A similar cell block structure is set forth in U.S. patent application Ser. No. 08/771,141 that was filed on 23 Jan. 1995, that is hereby incorporated by reference in its entirety.

Preferably, each of the memory cells 202 in the two cell blocks $201_0$, $201_1$ is a multi-bit memory cell (i.e. is a cell capable of storing more than one bit of data) having two terminals, a control terminal and a data terminal. The control terminal of each memory cell 202 is coupled to a corresponding word line to receive a control signal therefrom, while the data terminal is coupled to a corresponding bit line to receive data therefrom and to output data thereto. More specifically, the memory cells $202_{0,1}$–$202_{0,m}$ in cell block $201_0$ have their control terminals coupled to one of the word lines $WL_{0,1}$–$WL_{0,m}$, and their data terminals coupled to bit line $BL_0$. Similarly, the memory cells $202_{1,1}$–$202_{1,m}$ in cell block $201_1$ preferably have their control terminals coupled to one of the word lines $WL_{1,1}$–$WL_{1,M}$, and their data terminals coupled to the bit line $BL_1$. For each of the memory cells 202, it is the control terminal which determines whether the memory cell is activated. If a proper control signal is received at the control terminal, then the cell will be activated and data will be able to flow into and out of the cell. Otherwise, the cell will remain closed to the rest of the memory.

The memory cells 202 may take on a variety of structures. For example, memory cells 202 may take the form of conventional dynamic random access memory (DRAM) cells, each comprising a capacitor and a cell gate. The present invention may be implemented using such a cell structure. More preferably, however, because the memory cells 202 will be used to store multiple bits of data, the memory cells 202 preferably take the form shown in FIG. 3, wherein the cell 202 comprises a storage capacitor 302, an n-channel MOSFET QN, a p-channel MOSFET QP, and an inverter 304. Preferably, the n-channel MOSFET QN has its gate terminal coupled to a corresponding word line (WL), its source terminal coupled to the capacitor 302, and its drain terminal coupled to a corresponding bit line (BL), while the p-channel MOSFET QP has its gate terminal coupled to the word line via the inverter 304, its source terminal coupled to the capacitor 302, and its drain terminal coupled to the bit line.

In memory cell 202, capacitor 302 stores the voltage, and is, therefore, the data storage element. Storage capacitor 302 may be constructed using a number of different materials, including silicon dioxide. In the preferred embodiment, in order to increase the length of time that charge remains in the cell 202, storage capacitor 302 preferably has a dielectric constant of at least 1.5, and more preferably a dielectric constant greater than or equal to 2. A capacitor having such a large dielectric constant may be constructed using a number of different materials. These materials may include Tantalum Oxide ($Ta_2O_5$, $Ta_xO_{1-x}$), Titanium Oxide ($Ti_2O_2$, $Ti_xO_{1-x}$), Titanium Barium Oxide ($Ti_xBa_yO_{1-x-y}$), Tantalum Nitride ($Ta_xN_{1-x}$), Titanium Nitride ($Ti_xN_{1-x}$), and Zirconium Oxide ($Zr_xO_{1-x}$). As a matter of nomenclature, note that the subscripts (x, y, 1-x, 1-x-y) used above represent the percentages of the atoms of elements found in a particular substance, where x is between 0 and 1, and x+y is between 0 and 1. For example, the substance $Ta_{0.5}O_{0.5}$ has 50% Tantalum atoms and 50% Oxygen atoms, while the substance $Ti_{0.25}Ba_{0.25}O_{0.5}$ has 25% Titanium atoms, 25% Barium atoms, and 50% Oxygen atoms. A notation, such as $Ta_xO_{1-x}$, indicates that any combination of percentages of Tantalum and Oxygen may be used. Thus, many different materials, and many different mixtures of materials, may be used to construct capacitor 20. Other materials which may be used to construct storage capacitor 20 include polyethylene and Lead Zirconium Titanium Oxide (PZTO) ($Pb_{1.10}Zr_{0.48}Ti_{0.52}O_{3.1}$). The subscripts in PZTO represent atomic ratios. That is, for each 1.10 lead atoms, there are 0.48 Zirconium atoms, 0.52 Titanium atoms, and 3.1 Oxygen atoms. These and other materials, such as known insulators, may be used to construct the storage capacitor 302.

Figure 3:
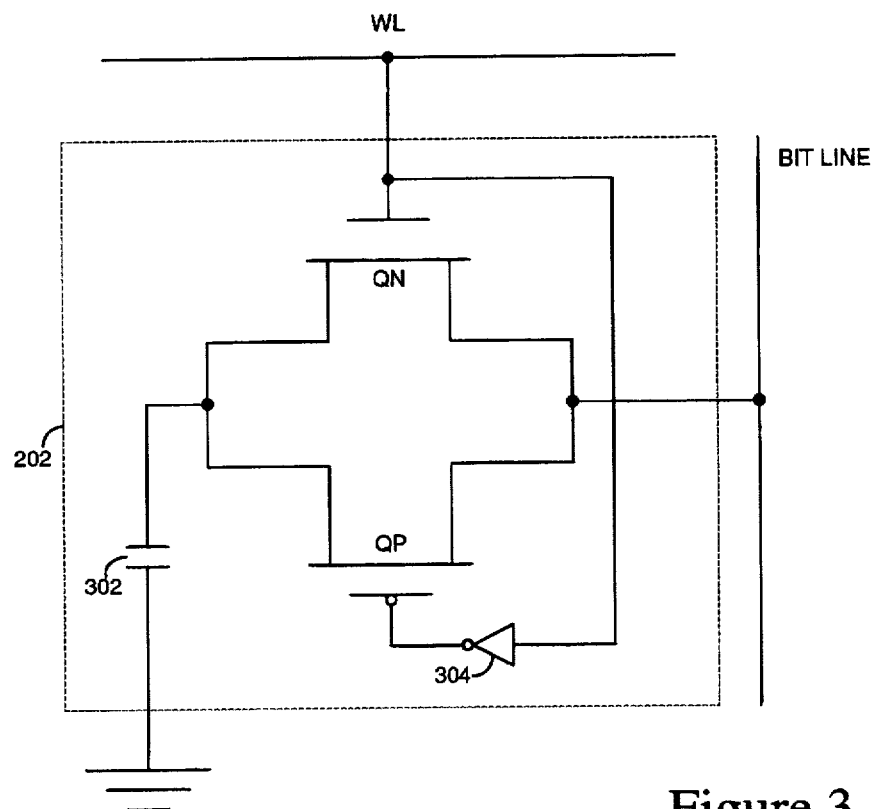
FIG. 3 is an illustration of a memory cell structure according to the preferred embodiment.

The cell structure shown in FIG. 3 has been chosen because of its noise-canceling capability. To elaborate, notice that when a proper control signal is received on the word line, both the n-channel MOSFET QN and the p-channel MOSFET QP are turned on to couple the capacitor 302 to the bit line. The n-channel MOSFET QN is turned on directly by the control signal, while the p-channel MOSFET QP is turned on by the inversion of the control signal.

Because both transistors QN, QP are turned on at the same time, both will simultaneously generate noise signals. Because the transistors QN, QP are of opposite polarity, however, their noise signals will cancel each other. Thus, noise effects are minimized by the cell structure of FIG. 3.

The effect of noise or transient signals is an important consideration in multi-bit memory cells. As mentioned previously, multiple bits of data are stored in a memory cell by dividing the full voltage range of the memory cell into a number of voltage sub-ranges. As the number of bits stored in the memory cell increases, the number of voltage sub-ranges also increases. As the number of voltage sub-ranges increases, the voltage step between voltage sub-ranges decreases. For memory cells which store a large number of bits, the voltage step between voltage sub-ranges becomes sufficiently small that noise signals can alter the data stored in the memory cells. To minimize the effects of noise, and thereby maximize the number of bits of data that can be stored in a memory cell, a noise-canceling cell structure such as that shown in FIG. 3 is preferably used as the basic memory cell.

Referring again to FIG. 2, memory portion 102 further comprises a pair of dummy cells $204_0$, $204_1$, each having a control terminal coupled to a dummy line ($DL_0$ or $DL_1$), and a data terminal coupled to a bit line ($BL_0$ or $BL_1$). More particularly, dummy cell $204_0$ has its control terminal coupled to dummy line $DL_0$ and its data terminal coupled to bit line $BL_0$, while dummy cell $204_1$ has its control terminal coupled to dummy line $DL_1$ and its data terminal coupled to bit line $BL_1$. Preferably, dummy cells $204_0$, $204_1$ have the same construction as the memory cells 202, such as that shown in FIG. 3. Even more specifically, dummy cells $204_0$, $204_1$ preferably have the same capacitances as the memory cells 202. This helps minimize the effects of stray capacitance. As will be explained later, dummy cells $204_0$ and $204_1$ are used to read data from the memory cells 202.

Memory portion 102 further comprises several pairs of gates, including discharge gates $206_0$, $206_1$, read gates $120_0$, $120_1$, and write gates $210_0$, $210_1$, which serve to selectively couple, in response to control signals received at their control terminals, certain components in memory portion 102 to certain other components. Specifically: (1) discharge gate $206_0$ selectively couples, in response to a control signal received on reset line $RL_0$, bit line $BL_0$ to ground to discharge the bit line; (2) discharge gate $206_1$ selectively couples, in response to a control signal received on reset line $RL_1$, bit line $BL_1$ to ground to discharge the bit line; (3) read gate 120B selectively couples, in response to a control signal received on read control line $RCL_0$, bit line $BL_0$ to capacitance gate 126B; (4) read gate 122B selectively couples, in response to a control signal received on read control line $RCL_1$, bit line $BL_1$ to capacitance gate 122B; (5) write gate $210_0$ selectively couples, in response to a control signal received on write control line $WCL_0$, bit line $BL_0$ to an analog output of a voltage reference source, not shown; and (6) write gate $210_1$ selectively couples, in response to a control signal received on write control line $WCL_1$, bit line $BL_1$ to an analog output of a voltage reference source, not shown. The utilization of these gates in reading data from one of the memory cells 202 is described below.

Figure 4:
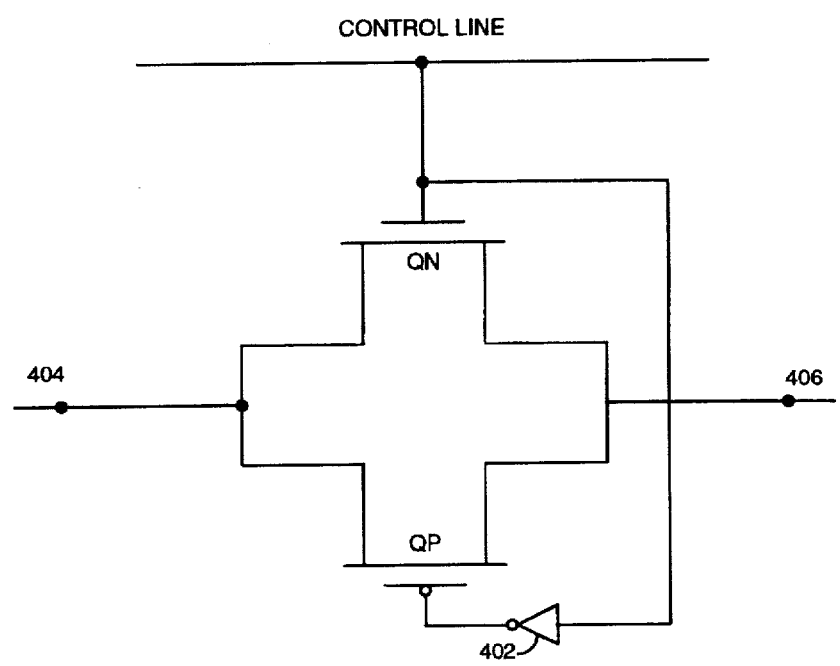
FIG. 4 is an illustration of the structure of the read gates and write gates according to the preferred embodiment.

Each of these gates 120, 122, 206, 210 has the structure shown in FIG. 4, comprising an n-channel MOSFET QN, a p-channel MOSFET QP, and an inverter 402. The n-channel MOSFET QN preferably has its gate terminal coupled to a control line for receiving a control signal therefrom, its source terminal coupled to a first component via terminal 404, and its drain terminal coupled to another component via terminal 406. Similarly, the p-channel MOSFET QP preferably has its gate terminal coupled to the control line via the inverter 402, its source terminal coupled to terminal 404, and its drain terminal coupled to terminal 406. As described above in connection with FIG. 3, this gate structure is advantageous because it minimizes the affect of noise signals. By implementing this gate structure in gates 120, 122, 206, and 210 of memory portion 102, noise creation and transference will be kept to a minimum.

Memory portion 102 further comprises a pair of capacitance gates 126, 128. As will be discussed in greater detail below, when a memory cell 202 is read the voltage stored in the memory cell is applied to one input of each of the comparators 104. In order to equalize the capacitive load of bit lines 116, 118, the capacitance of the complementary bit line, i.e., the bit line associated with the dummy cell 204, must be increased to match the capacitance of the primary bit line, i.e., the bit line associated with the memory cell. The matching of the capacitive loads is necessary because the primary bit line is coupled to the comparators 104 via a data bus, e.g., 108, and, therefore, the primary bit line generally has a larger capacitive load. Matching the capacitive loads of the bit lines 116, 118, minimizes the differences in voltage degradation over the bit lines.

Figure 5:
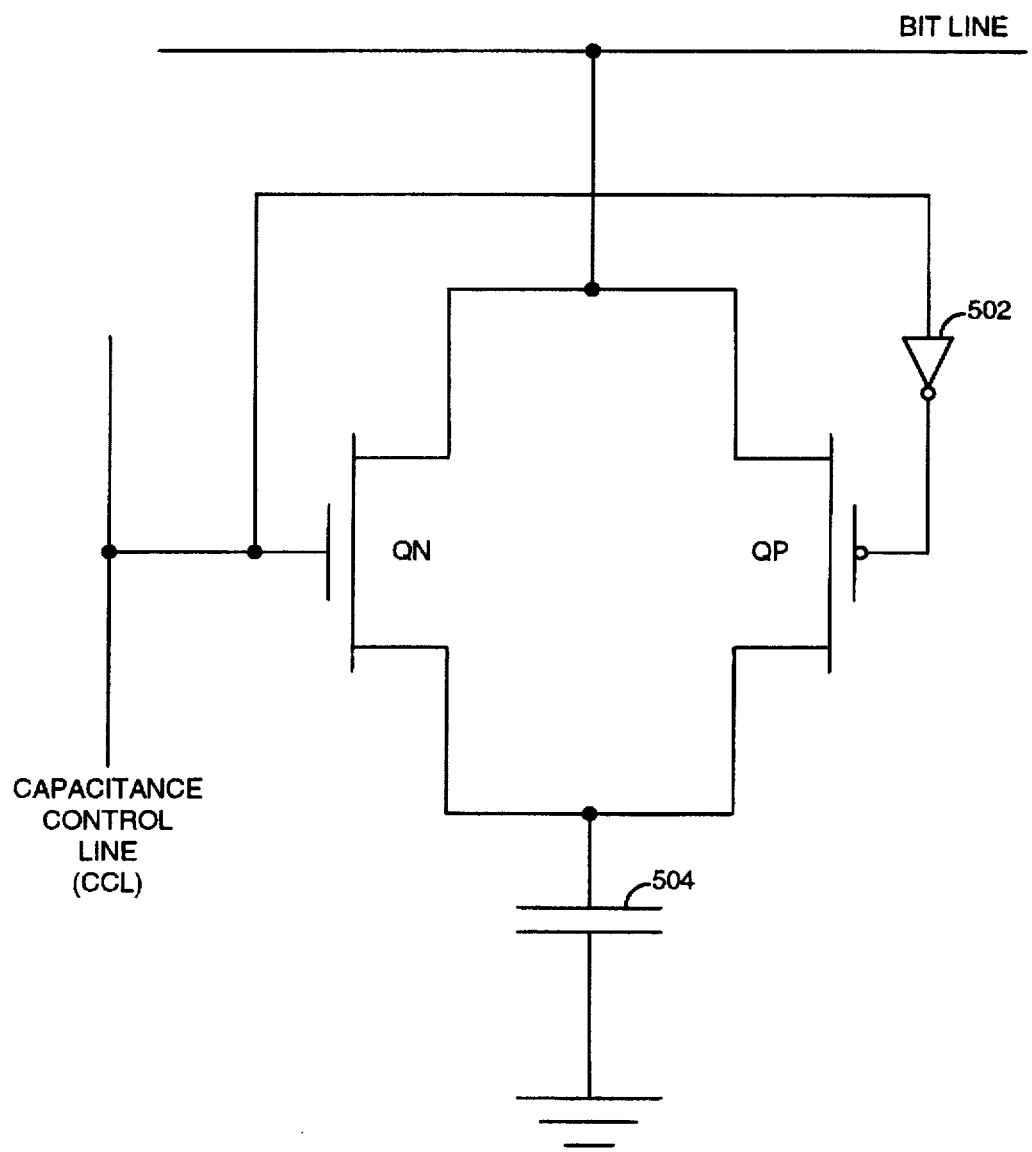
FIG. 5 is an illustration of the structure of the capacitance gates according to the preferred embodiment.

Each of the capacitance gates 126, 128 has the structure shown in FIG. 5, comprising an n-channel MOSFET QN, a p-channel MOSFET QP, an inverter 502, and capacitor 504. The n-channel MOSFET QN has its gate coupled to a capacitance control line (CCL), its source terminal coupled to a capacitor 504, and its drain terminal coupled to a bit line (BL). Similarly, the p-channel MOSFET QP has its gate coupled to the CCL via inverter 502, its source terminal coupled to capacitor 504, and its drain terminal coupled to a bit line (BL). As described above in connection with FIG. 3, this gate structure is advantageous because it minimizes the generation of noise signals.

Referring again to FIG. 1 and 2, memory portion 102 further comprises a pair of bus switches 108, 112. As will be discussed in greater detail below, when reading a memory cell, a primary bit line, e.g., 116B, couples the memory cell to each of the comparators 104. However, since each comparator 104 is associated with two distinct bit lines, e.g., comparator 104B is associated with bit lines 116B and 118B and comparator 104C is associated with bit lines 116C and 118C, the bus switches 108, 112 control which bit lines (BL) are coupled to the comparator 104. For example, in order to couple bit line 116B to comparator 104C, bus switch A 108C connects comparator 104C to data bus A 106 and disconnects the comparator 104C from bit line 116C.

Figure 6:
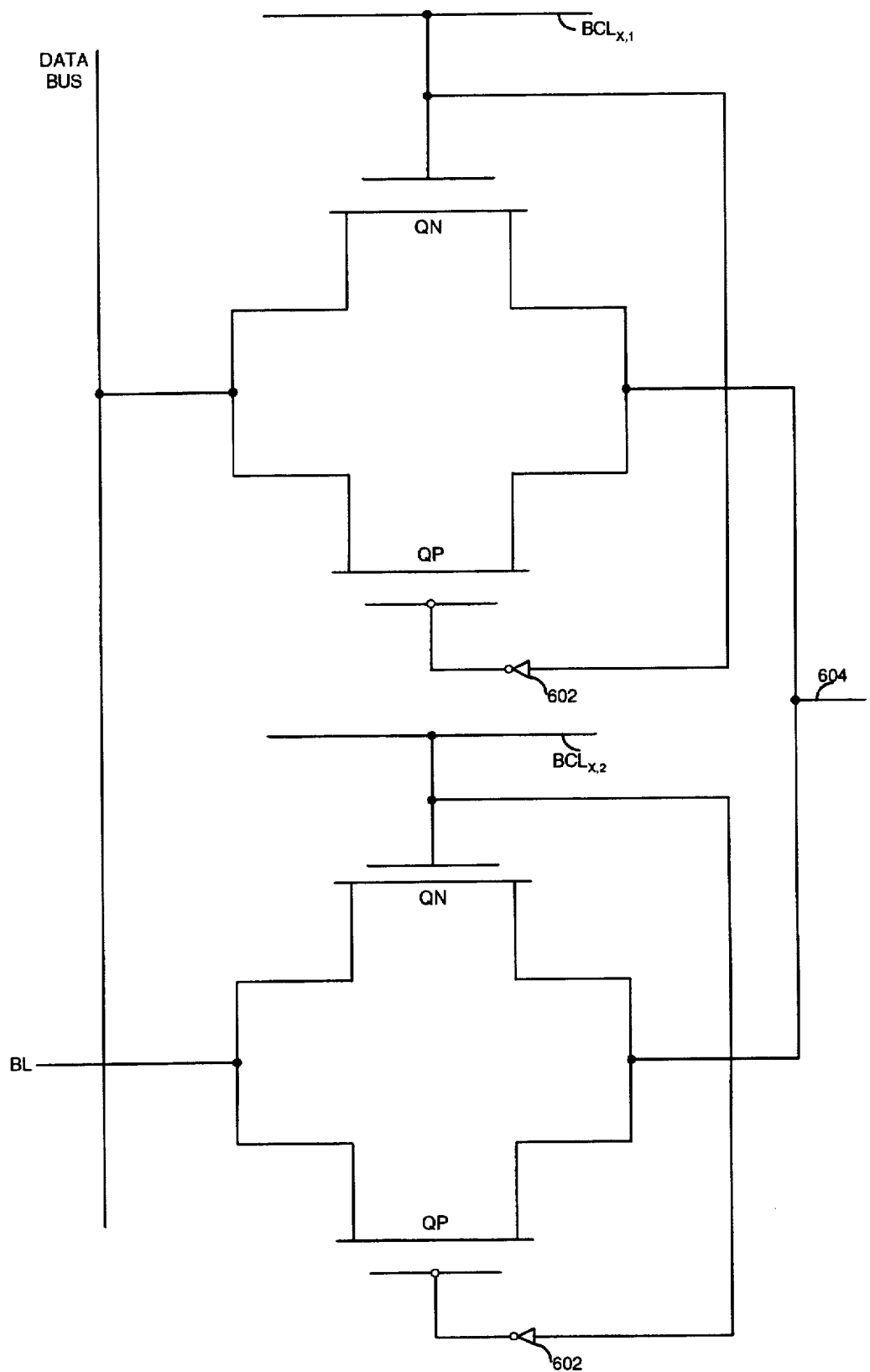
FIG. 6 is an illustration of the structure of the bus switches according to the preferred embodiment.

Each of the data bus switches 108, 112 has the structure shown in FIG. 6, comprising two switches, each having an n-channel MOSFET QN, a p-channel MOSFET QP, and an inverter 602, 603. The first n-channel MOSFET QN has its gate coupled to a bus control line ($BCL_{x,1}$), its source terminal is coupled to one of the data buses 106, 110, and its drain terminal is coupled to a comparator 104 and to the second switch via node 604. The first p-channel MOSFET QP has its gate coupled to a bus control line ($BCL_{x,1}$) via inverter 602, its source terminal is coupled to one of the data buses 106, 110, and its drain terminal is coupled to a comparator 104 and to the second switch via node 604. The second n-channel MOSFET QN has its gate coupled to a bus control line ($BCL_{x,2}$), its source terminal is coupled to a bit line (BL), and its drain terminal is coupled to a comparator 104 and the first switch via node 604. The second n-channel MOSFET QN has its gate coupled to a bus control line ($BCL_{x,2}$) via inverter 603, its source terminal is coupled to a bit line (BL), and its drain terminal is coupled to a comparator 104 and the first switch via node 604. As described above in connection with FIG. 3, this gate structure is advantageous because it minimizes the effect of noise signals.

Referring again to FIGS. 1 and 2, in addition to the components already described, memory portion 102 further comprises a comparator 104. The comparator 104 serves to compare voltages appearing on bit lines $BL_0$ and $BL_1$ to each other, and to provide a comparison result at its output. This comparison result is provided to the input of the controller 130. In response to the outputs of all of the comparators 104, the controller 130 performs several tasks. As will be discussed in greater detail below, the controller repeatedly causes reference voltages to be generated, based upon the outputs of the comparators 104, until the controller 130 determines the bit values represented by the voltage in a memory cell 202. Updated values of the reference voltages are dependent upon the previous comparisons performed by the comparators 104. The updated values of the reference voltages can be determined using a variety of methods, including, a sequential search method or an exponential isolation method. In addition, the controller 130 controls the voltage that is applied to each of the control lines, as described below.

Figure 7A:
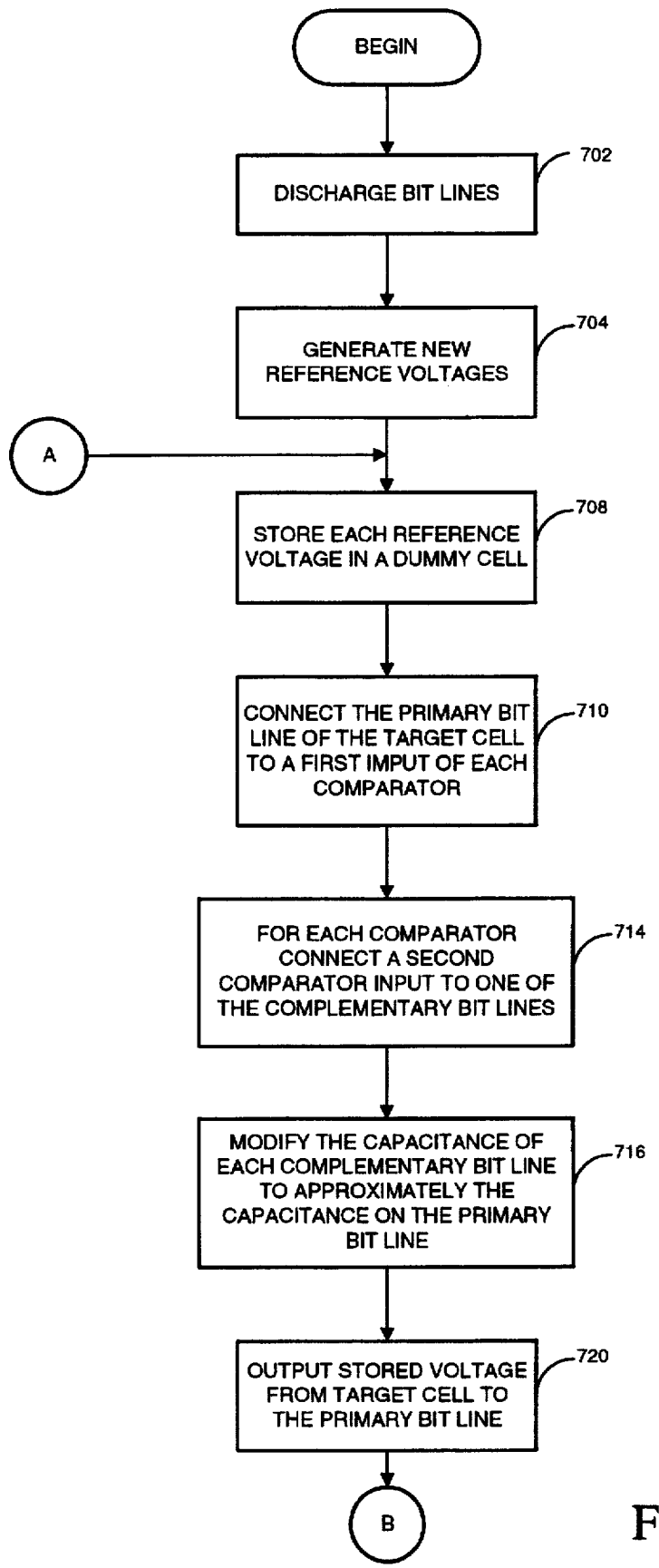
FIGS. 7A–B are a flow diagram illustrating the method of the preferred embodiment.
Figure 7B:
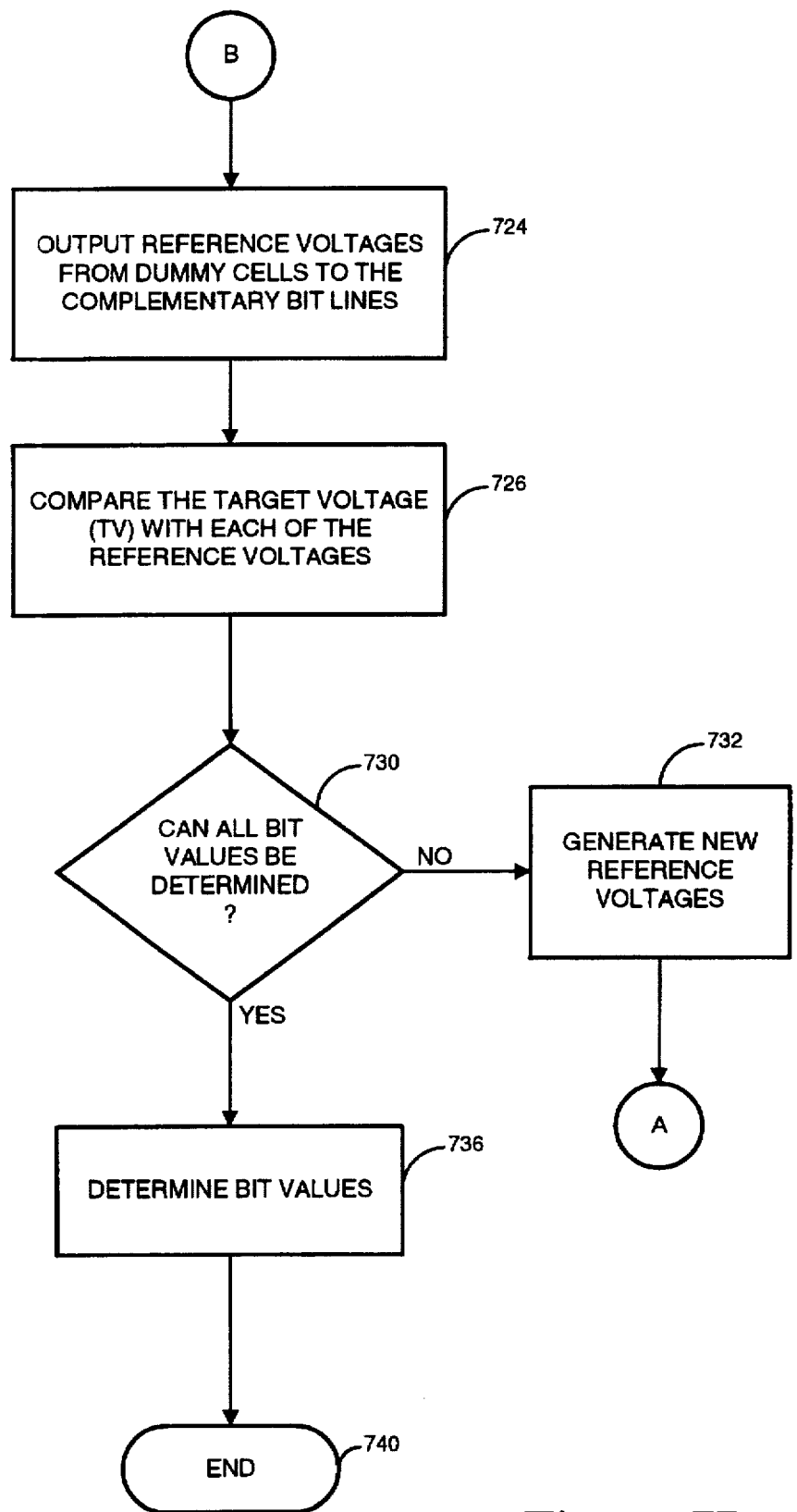

FIG. 7 is a flowchart illustrating the method of reading a multi-bit memory cell according to the preferred embodiment of the present invention. As an initial matter, it should be noted that the control signals used to control the various components in portion 102 are provide by the controller 130 or an external control circuit (not shown). These control signals include the signals appearing on the word lines $WL_{0,1}$–$WL_{0,n}$ and $WL_{1,1}$–$WL_{1,m}$, the dummy lines $DL_0$, $DL_1$, the reset lines $RL_0$, $RL_1$, the read control lines $RCL_0$, $RCL_1$, the write control lines $WCL_0$, $WCL_1$, the capacitor control lines $CCL_0$, $CCL_1$, and the bus control lines $BCL_{0,1}$, $BCL_{0,2}$, $BCL_{1,1}$, $BCL_{1,2}$. The controller 130, which may take the form of a state machine, may be similar in structure, although not in function, to control circuits typically found on multi-bit memories for controlling access to the memory cells.

In order to read data out of memory 114, a target cell (i.e. a cell from which data is to be read) is first selected. Once the target cell is selected, the primary and complementary cell blocks, and the primary and complementary bit lines are determined. As a matter of terminology, the cell block having the target cell contained therein is designated the primary cell block, while the other cell block is designated the complementary cell block. Also, the bit line associated with the primary cell block is designated as the primary bit line while the bit line associated with the complementary cell block is designated as the complementary bit line. Which cell block and which bit line is primary depends upon which memory cell is selected. For example, with reference to FIG. 2, if memory cell $202_{0,1}$ is the target cell, then cell block $201_0$ is the primary cell block and bit line $BL_0$ is the primary bit line. On the other hand, if memory cell $202_{1,1}$ is the target cell, then cell block $201_1$ is the primary cell block and bit line $BL_1$ is the primary bit line. For illustrative purposes, it will be assumed here that memory cell $202_{0,1}$ is the target cell. Thus, in the following example, cell block $201_0$ will be the primary cell block, cell block $201_1$ will be the complementary cell block, bit line $BL_0$ will be the primary bit line, and bit line $BL_1$ will be the complementary bit line. With reference to FIGS. 1, 2, and 7, the process of reading data from cell $202_{0,1}$ will now be described.

As shown in FIG. 7, the reading process is initiated by discharging 702 the primary bit line $BL_0$. This is preferably achieved by having the controller 130 send a control signal on reset line $RL_0$ to turn on the discharge gate $206_0$ that is coupled to the primary bit line $BL_0$. Once turned on, gate $206_0$ couples the bit line $BL_0$ to ground to remove any lingering charge. This discharging process serves to "cleanse" the primary bit line $BL_0$ before data from the target cell is loaded onto the bit line $BL_0$.

Once the primary bit line is cleansed, the controller 130 begins the reading process. The controller 130 begins operation by instructing a voltage source (not shown) to generate 704 an initial set of reference voltages. The controller 130 sets the initial reference voltage level based upon the method used to determine the multi-bit memory cell voltage (target voltage). As discussed above, there are many methods that can be used, including: (1) a sequential search method; or (2) an exponential isolation method. Each of these methods is discussed below beginning with the sequential search method.

As will be discussed below, the voltage on the primary bit line $BL_0$ will be compared to each of a set of reference voltages simultaneously. The controller 130 causes a different reference voltage to be applied to each of the complementary bit lines 118A–D. The reference voltage is applied to each of the complementary bit lines 118A–D and then stored in a dummy cell, e.g. $204_1$. When the controller 130 utilizes the sequential search method the initial reference voltage stored in each dummy cell is equal to:

$$V_{ref(1)}(p) = (p - 0.5)(LSB) \qquad \text{Eq. (1)}$$

where $V_{ref(1)}$ (p) is equal to the reference voltage stored in the dummy cell, "p" is an integer variable having a maximum value that is equal to the number of comparators (in FIG. 1, the maximum value of p is four), and LSB is equal to the voltage step between consecutive voltage sub-ranges. The voltage step, LSB, is equal to the full range of voltages (MSB) that can be stored in a memory cell 202, e.g., 4 volts if the full voltage range of a multi-bit memory cell can be between 0 volts and 4 volts, divided by the number of voltage sub-ranges. A voltage sub-range is defined as the integer two raised to the "n" power, where n is equal to the number of bits stored in the multi-bit memory cell 202. For example, if a multi-bit memory cell represents 4 bits the number voltage sub-ranges is equal to 16, i.e., $2^4$. FIG. 8 is a table illustrating the voltage values representing a four bit memory cell having a voltage range of four volts.

As illustrated in FIG. 8 a multi-bit memory cell representing four bits has 16 sub-ranges. Each voltage step is equal to the MSB divided by the number of sub-ranges, i.e., 4/16=0.25 volts. In order to reduce comparison errors when comparing the target voltage with the reference voltages, the reference voltages are set to a voltage between two consecutive voltage sub-ranges. For example, the controller 130 sets a reference voltage that is approximately equal to 0.625 volts, i.e., midway between 0.50 volts and 0.75 volts.

Using equation (1) and the voltages/bit values illustrated in FIG. 8 the initial reference voltages are equal to the values shown in equation (2):

$$V_{ref(1)}(1) = 0.125 \text{ volts}$$

$$V_{ref(1)}(2) = 0.375 \text{ volts}$$

$$V_{ref(1)}(3) = 0.625 \text{ volts}$$

$$V_{ref(1)}(4) = 0.875 \text{ volts} \qquad \text{Eq. (2)}$$

Where $V_{ref(1)}$ (1) is stored in dummy cell $204_1$ in memory 114A, $V_{ref(1)}$ (2) is stored in dummy cell $204_1$ in memory 114B, $V_{ref(1)}$ (3) is stored in dummy cell $204_1$ in memory 114C, and $V_{ref(1)}$ (4) is stored in dummy cell $204_1$ in memory 114D. In order to store the reference voltages in the dummy cells 204 the controller 130 generates a write signal to the write control line (WCL$_1$) that permits the reference voltage to pass onto the complementary bit line 118B. The controller 130 then generates a control signal on the dummy line (DL$_1$) which cause the dummy cell to store the reference voltage present on the complementary bit line 118B.

The controller 130 generates a command on the bus control lines (BCL$_{0,1}$, BCL$_{0,2}$) to connect 710 the primary bit line 116B to data bus A 106 via the bus A switch 108B. As illustrated in FIG. 6, if both control lines, BCL$_{0,1}$, BCL$_{0,2}$, are on, data bus A 116B and bit line BL$_0$ are connected to comparator 104B via node 604.

The controller 130 then generates a bus control signal on bus control line, BCL$_{1,2}$, to connect the second input of the comparator with the complementary bit line 118B. In addition, the controller generates a bus control signal on bus control line BCL$_{1,1}$ to disconnect the comparator from data bus B 110.

In order to reduce errors as a result of different capacitances between the two comparator inputs, the controller 130 generates a control signal, CCL, modifying 716 the capacitance on each of the complementary bit lines 118. The capacitance is modified in order to equalize the capacitive load of the complementary bit lines 118 and the primary bit line 116B. Matching the capacitive load of the primary bit line 116B and each of the complementary bit lines 118 reduces voltage degradation errors that occur when a voltage is transmitted by lines having different capacitive loads. By matching the capacitive loads, the voltage reduction resulting from line capacitances is approximately equal for the primary bit line 116B and each of the complementary bit lines 118, when viewed from each comparator 104.

After modifying 716 the capacitance on each complementary bit line 118 the controller 130 generates a signal on the write line, WL$_{0,1}$, of the target memory cell $202_{0,1}$. The target memory cell $202_{0,1}$ outputs 720 the voltage stored in capacitor 302 to the primary bit line 116B. The controller 130 concurrently generates a signal on each of the dummy lines (DL$_1$) associated with the complementary bit lines 118. As a result, the dummy cells $206_1$ output 724 the stored reference voltages to the associated complementary bit line 118A–D.

The controller 130 then generates a control signal on the read control lines RCL$_0$, RCL$_1$. As a result, the target voltage on the primary line is applied to the first input of each of the comparators 104 and each initial reference voltage $V_{ref(1)}$(p) is applied to the second input of its associated comparator 104.

Concurrently, each comparator 104 compares 726 the target voltage with the reference voltage applied to its second input. Each comparator 104 determines whether the target voltage applied to its first input is larger than the reference voltage applied to its second input. The comparators 104 output a binary 0 or 1 as a result of this comparison. The controller 130 determines 730 if all of the bits represented by the target voltage can be determined.

One technique for determining whether all of the bits represented by the target voltage can be determined is to identify the comparator having the smallest applied reference voltage that exceeds the target voltage. As an example, if two comparators, e.g., 104A and 104B, determine that the target voltage exceeded its reference voltage and the remaining comparators, i.e., 104C and 104D, determine that its reference voltage exceeded the target voltage. Using the technique described above, the controller 130 would determine that the reference voltage applied to comparator 104C was the lowest voltage that exceeded the target voltage. As discussed above, the initial reference voltage applied to comparator 104C is 0.625 volts. As shown in FIG. 8 the first data voltage level less than 0.625 volts is 0.50 volts. Therefore, in this example, the value of the multi-bit memory cell is equal to 0010. In this example, only one clock cycle is necessary to determine the value of a four bit memory cell.

If all of the bits cannot be determined, e.g., if none of the reference voltages exceed the target voltage, the controller causes new reference voltages to be generated 732. The value of the new reference voltages are set forth in equation (3).

$$V_{ref(N)}(p) = V_{ref(N-1)}(p_{max})(p)(LSB) \qquad \text{Eq. (3)}$$

Where N is equal to number of comparisons, e.g., in the initial comparison discussed above, N is equal to one (1), during the next iteration N is equal to two, (2). $P_{max}$ is equal to the maximum number of comparators. $V_{ref(N-1)}(p_{max})$ is equal to the highest reference voltage of the previous iteration. In the current example, $V_{ref(N-1)}(p_{max})$ is equal to 0.875 volts, i.e., $V_{ref(1)}$(4). Using equation (3), the comparator 130 sets the second iteration of reference voltages to:

$V_{ref(2)}(1) = 1.125$ volts $V_{ref(2)}(2) = 1.375$ volts $V_{ref(2)}(3) = 1.625$ volts $V_{ref(2)}(4) = 1.875$ volts  \qquad Eq. (4)

Steps 708 to 730 are repeated with the reference voltages equal to the values set forth in equation (4). If all of the bits represented by the target voltage cannot be determined, new reference voltages are generated according to equation (3) with N=3. As a result the reference voltages are equal to:

$V_{ref(3)}(1) = 2.125$ volts $V_{ref(3)}(2) = 2.375$ volts $V_{ref(3)}(3) = 2.625$ volts $V_{ref(3)}(4) = 2.875$ volts \qquad Eq. (5)

Steps 708 to 730 are repeated with the reference voltages equal to the values set forth in equation (5). If all of the bits represented by the target voltage still cannot be determined, new reference voltages are generated according to equation (3) with N=4. As a result the reference voltages are equal to:

$V_{ref(4)}(1) = 3.125$ volts $V_{ref(4)}(2) = 3.375$ volts $V_{ref(4)}(3) = 3.625$ volts $V_{ref(4)}(4) = 3.875$ volts \qquad Eq. (6)

Steps 708 to 730 are repeated with the reference voltages equal to the values set forth in equation (6). Since $V_{ref(4)}$ (4) is higher that any voltage value associated with a possible bit combination in FIG. 8, the controller 130 can determine 736 the value of the data bits represented by the target voltage. In the slowest case, the sequential search method requires 4 clock cycles to determine the value of a four bit memory cell when four comparators are utilized. This is a significant savings over conventional systems that have one comparator associated with a single pair of bit lines. In such systems it may require 16 clock cycles to determine the value of a four bit memory cell.

If the controller 130 uses the exponential isolation method to set the reference voltages applied to each comparator 104, the target voltage is exponentially isolated. When employing the exponential isolation method, steps 708–726, shown in FIG. 7, are the same as steps 708–726 described above with reference to the sequential search method. The major distinctions between the two methods lie in the values generated for the reference voltages in steps 704 and 732 and in the determination of the data bits in step 730 and 736. The technique for determining the reference voltages and in determining the data bits is now discussed.

Using the system illustrated in FIG. 1, each the initial reference voltage associated with each comparator 104A–D is based upon equation (7).

$$V_{ref}(1,y) = DIV\left[\frac{MSB(1) \cdot y}{(m+1) \cdot LSB}\right] \cdot LSB + \frac{LSB}{2} \qquad \text{Eq. (7)}$$

In equation (7) "y" is equal to the comparator associated with the reference voltage, e.g., for comparator 104A, y=1; for comparator 104B, y=2; for comparator 104C, y=3; and for comparator 104D, y=4. MSB(1) is equal to the full range of the voltage that can be stored in the multi-bit memory cell $202_{0,1}$. In the present example, as illustrated in FIG. 8, MSB(1) is equal to 4 volts. The variable LSB is equal to the voltage sub-range, defined above. In the present example, LSB is equal to 0.25 volts. The variable "m" is equal to the total number of comparators used in the exponential isolation method. In the present example, m is equal to 4. The "DIV" function is the integer division function (divide and truncate function) used in, e.g., PASCAL. Using equation 7, the initial reference voltages that are generated in step 704 are:

$$V_{ref}(1,1) = DIV[4/1.25](0.25) + 0.125 = 0.875 \text{ volts}$$

$$V_{ref}(1,2) = DIV[8/1.25](0.25) + 0.125 = 1.625 \text{ volts}$$

$$V_{ref}(1,3) = DIV[12/1.25](0.25) + 0.125 = 2.375 \text{ volts}$$

$$V_{ref}(1,4) = DIV[16/1.25](0.25) + 0.125 = 3.125 \text{ volts} \qquad \text{Eq. (8)}$$

Note that the first reference voltage for each comparator 104 is not set equal to a voltage associated to a data bit combination (data bit voltage), e.g., 0.25 volts or 0.50 volts in FIG. 8. Instead the voltage is set at ½ LSB below any data bit voltage. This is done to minimize the probability of error. As discussed above, the data bit voltage represents the dividing line between two consecutive voltage sub-ranges. If the reference voltage is set here, and the voltage stored in the target cell happens to be within one of the two voltage sub-ranges adjacent to the midpoint voltage, then a small amount of noise may affect whether the reference voltage is higher than or lower than the voltage in the target cell. In other words, noise may change the outcome of a comparison, which is not desirable. To minimize the probability of this occurring, the reference voltage is preferably set at ½ LSB below any data bit voltage. This serves to place the reference voltage in the middle of a voltage sub-range rather than at the border of two adjacent voltage sub-ranges. By so doing, the probability that noise will affect the outcome of a comparison is kept to a minimum.

If the target voltage is equal to 2.75 volts (representing data bits 1011, as shown in FIG. 8) then comparators 104A, 104B, and 104C will determine that its applied reference voltage is less than the target voltage. In contrast, comparator 104D will determine that its applied reference voltage, $V_{ref}(1,4)$, exceeds the target voltage.

The results of the comparators 104 are output to the controller 130. The controller determines that the target voltage is between $V_{ref}(1,3)$ and $V_{ref}(1,4)$, i.e., between 2.375 volts and 3.125 volts. The difference between these voltages (0.750 volts) is the new voltage range. The controller 130 cannot determine 730 values of the data bits represented by the target voltage because more than one data bit voltage is between $V_{ref}(1,3)$ and $V_{ref}(1,4)$. Therefore, the controller 130 causes new reference voltages to be generated 732. The controller uses the results from the previous comparisons to set the value of new reference voltages. Preferably, the new reference voltages are set according to equation (9).

$$V_{ref}(x,y) = V_{ref}(x-1,z) + DIV\left[\frac{MSB(x) \cdot y}{(m+1) \cdot LSB}\right] \cdot LSB \qquad \text{Eq. (9)}$$

In equation (9) "x" is equal to the comparison iteration. In the present example the reference voltages are to be used in the second comparison therefore, x is equal to 2. The variable "z" is equal to the number of the comparator having the highest voltage that was less than the target voltage in the previous comparison. In the present example, z is equal to 3 since comparator 104C had the highest voltage that was less than the target voltage in the first comparison. MSB(x) is equal to the new voltage range defined above, i.e., 0.750 volts. Accordingly, the new reference voltages are set forth in equation (10).

$$V_{ref}(2,1) = 2.375 + DIV[0.75/1.25](0.25) = 2.375 \text{ volts}$$

$$V_{ref}(2,2) = 2.375 + DIV[1.50/1.25](0.25) = 2.625 \text{ volts}$$

$$V_{ref}(2,3) = 2.375 + DIV[2.25/1.25](0.25) = 2.625 \text{ volts}$$

$$V_{ref}(2,4) = 2.375 + DIV[3.00/1.25](0.25) = 2.875 \text{ volts} \qquad \text{Eq. (10)}$$

Note that the reference voltages associated with comparator 104B and comparator 104C are equal. This occurs because the new voltage range (0.750 volts) is equal to three voltage steps (0.250 volts) and there are four comparators. Therefore, one reference voltage is duplicated on two different comparators 104B, 104C.

In the present example, the target voltage is equal to 2.75 volts. Therefore, comparators 104A, 104B, and 104C will determine that its applied reference voltage is less than the target voltage. In contrast, comparator 104D will determine that its applied reference voltage, $V_{ref}(2,4)$, exceeds the target voltage. These results are sent to the controller 130. Since only one data bit voltage is between $V_{ref}(2,3)$ and $V_{ref}(2,4)$, the controller determines 730, 736 that the data bit voltage is equal to 2.75 volts. This voltage is associated with the data bits "1011" as illustrated in FIG. 8.

When the controller 130 utilizes the exponential isolation method described above it will always be able to determine the value of a four bit memory in at most two comparisons when four comparators 104 are employed. The exponential isolation method efficiently discerns the bit value represented by the target voltage. The number of clock cycles necessary to determine the value of a multi-bit memory cell representing "n" bits is set forth in equation (11).

$$x \geq \log_m 2^n \qquad \text{Eq. (11)}$$

In equation (11) "m" is equal to the number of comparators, and "x" is an integer equal to the number of comparisons, i.e., clock cycles, necessary to determine a multi-bit memory cell storing "n" bits. For example, the present invention would require 3 clock cycles if 16 comparators are utilized in order to determine an 8 bit memory cell, as shown if equation (12).

$$x \geq \log_m 2^n = \log_{16} 2^8 = 3 \qquad \text{Eq. (12)}$$

In comparison, the traditional system, i.e., a system not having multiple comparators coupled to a data bus, requires 256 clock cycles to determine the value of an 8 bit memory cell.

It is envisioned that the controller 130 can employ alternate search methods without departing from the spirit and scope of the present invention, e.g., using a variation of the successive approximation analog to digital conversion method, described in U.S. patent application Ser. No. 08/771,141, filed on 23 Jan. 1995, that was previously incorporated by reference in its entirety. This method couples one successive approximation analog to digital converter (SAAD) to the output of each comparator 104. The SAAD's systematically alter the reference voltages until the bits stored in the multi-bit memory cell 202 can be determined.

The present invention provides a substantially faster reading of a multi-bit memory cells, when compared to traditional systems, without requiring an overly burdensome amount of additional circuitry.

While the invention has been particularly shown and described with reference to a preferred embodiment and several alternate embodiments thereof, it will be understood by persons skilled in the relevant art that various change in form and details can be made therein without departing from the spirit and scope of the invention.

What is claimed is:

1. The method of reading a first multi-bit memory cell, comprising the steps of:

(1) generating a first reference voltage on a first bit line and a second reference voltage on a second bit line;

(2) coupling a third bit line to an input of a first comparator and an input of a second comparator, said first comparator associated with said first bit line and the first multi-bit memory cell and said second comparator associated with said second bit line and a second multi-bit memory cell;

(3) outputting a first memory voltage, representing a plurality of data bits, from the first multi-bit memory cell to said third bit line;

(4) comparing said first memory voltage with said first reference voltage and said, second reference voltage, simultaneously, using said first comparator and said second comparator;

(5) determining said bit value for one or more of said data bits based upon a result of said comparison step, if one or more of said data bit values can be determined;

(6) generating a third reference voltage on said first bit line and a fourth reference voltage on said second bit line based upon the previous comparison result, if all of said data bit values have not been determined;

(7) comparing said first memory voltage with said third reference voltage and said fourth reference voltage, simultaneously, if all of said data bit values have not been determined;

(8) determining a value for one or more of said data bits based upon the result of the previous comparison steps, if one or more of said data bit values can be determined, and if all of said data bit values have not been previously determined; and (9) repeating steps (6) through (8) until determining a data bit value for all of said data bits.

2. The method of claim 1, further comprising the steps of: reading said second multi-bit memory cell, including the steps of:

(a) generating said first reference voltage on said first bit line and said second reference voltage on said second bit line;

(b) coupling a fourth bit line, to an input of said plurality of comparators;

(c) outputting a second memory voltage, representing a plurality of second cell data bits, from the second multi-bit memory cell to said fourth bit line;

(d) comparing said second memory voltage with said first reference voltage and said second reference voltage, simultaneously;

(e) determining a value for one or more of said second cell data bits based upon the result of said comparison step, if a value of one or more of said second cell data bits can be determined;

(f) generating a third reference voltage on a first bit line and a fourth reference voltage on a second bit line based upon said latest comparison result, if all of said second cell data bits have not been determined;

(g) comparing said first memory voltage with said third reference voltage and said fourth reference voltage, simultaneously, if all of said second cell data bits have not been determined;

(h) determining a value for one or more of said data bits based upon the result of the previous comparison steps, if a value of one or more of said second cell data bits can be determined, and if all of said second cell data bits have not been previously determined; and (i) repeating steps (f) through (h) until determining a value for all of said second cell data bits.

3. The method of claim 1, further comprising the steps of: modifying the capacitance of said first bit line and said second bit line to approximately the capacitance of said third bit line.

4. The method of claim 1, wherein said step of generating said first reference voltage and said second reference voltage includes the step of:

determining said first reference voltage according to the following formula:

first reference voltage=$(p-0.5)(LSB)$;

determining said second reference voltage according to the following formula:

second reference voltage=$(p-0.5)(LSB)$;

wherein "p" is an integer variable having a maximum value that is equal to a number of comparators, and LSB is equal to a voltage step between consecutive voltage sub-ranges.

5. The method of claim 4, wherein said step of generating said third reference voltage and said fourth reference voltage includes the step of:

determining said third reference voltage according to the following formula:

third reference voltage=$V_{ref(N-1)}(p_{max})(p)(LSB)$; and determining said forth voltage according to the following formula:

fourth reference voltage=$V_{ref(N-1)}(p_{max})(p)(LSB)$;

wherein N is equal to number of comparisons, $P_{max}$ is equal to a maximum number of comparators, and $V_{ref(N-1)}(p_{max})$ is equal to a highest reference voltage of a previous iteration.

6. The method of claim 1, wherein said step of generating said first reference voltage and said second reference voltage includes the step of:

determining said first reference voltage according to the following formula:

$$V_{ref}(1,1) = DIV\left[\frac{MSB(1)}{(m+1)\cdot LSB}\right] \cdot LSB + \frac{LSB}{2} \text{ ; and}$$

determining said second reference voltage according to the following formula:

$$V_{ref}(1,2) = DIV\left[\frac{MSB(1)\cdot 2}{(m+1)\cdot LSB}\right] \cdot LSB + \frac{LSB}{2} \text{ ;}$$

wherein $V_{ref}(1,1)$ is equal to said first reference voltage, $V_{ref}(1,2)$ is equal to said second reference voltage, MSB(1) is equal to a maximum voltage range that can be stored in said first multi-bit memory cell, LSB is equal to said voltage sub-range, "m" is equal to said total number of comparators, and "DIV" is a divide and truncate function.

7. The method of claim 6, wherein said step of generating said third reference voltage and said fourth reference voltage includes the steps of:

determining said third reference voltage according to the following formula:

$$V_{ref}(x,1) = V_{ref}(x-1,z) + DIV\left[\frac{MSB(x)\cdot 1}{(m+1)\cdot LSB}\right] \cdot LSB;$$

determining said fourth reference voltage according to the following formula:

$$V_{ref}(x,2) = V_{ref}(x-1,z) + DIV\left[\frac{MSB(x)\cdot 2}{(m+1)\cdot LSB}\right] \cdot LSB;$$

wherein, $V_{ref}(x,1)$ is said third reference voltage, $V_{ref}(x,2)$ is said fourth reference voltage, x is equal to the comparison iteration, $V_{ref}(x-1,z)$ is equal to a reference voltage having a the highest voltage that did not exceed the second memory voltage in a previous iteration, MSB(x) is equal to a difference in said first reference voltage said second reference voltage in a previous iteration.

8. A computer memory system comprising:

a first bit line;

a second bit line;

a first data line, removably coupled to said first bit line and removably coupled to said second bit line;

a first multi-bit memory cell, coupled to said first bit line, for storing a first voltage representing a plurality of first cell data bits;

a second multi-bit memory cell, coupled to said second bit line, for storing a second voltage representing a plurality of second cell data bits;

a first comparator, having a first input removably coupled to one of said first bit line and said first data line, a second input, and a first output, for comparing a voltage on said first input with a voltage on said second input;

a second comparator, having a third input removably coupled to one of said second bit line and said first data line, a fourth input, and a second output, for comparing a voltage on said third input with a voltage on said fourth input.

9. The computer memory system of claim 8, further comprising:

a controller for generating a first signal that controls a coupling of said first data line with one of said first bit line and said second bit line, and for generating a second signal that controls the coupling of said first comparator with at least one of said first bit line and said first data line.

10. The computer memory system of claim 9, wherein said controller determines said voltages on said second input and said fourth input in response to said first output and said second output and wherein said controller determines the value of said plurality of first cell data bits in response to said first output and said second output.

11. The computer memory system of claim 10, wherein said controller determines an initial voltage on said second input based upon the following formula:

initial voltage at second input=$(p-0.5)(LSB)$, and wherein said controller determines an initial voltage on said fourth input according to the following formula:

initial voltage at fourth input=$(p-0.5)(LSB)$, wherein "p" is an integer variable having a maximum value that is equal to a number of said comparators, and LSB is equal to a voltage step between consecutive voltage sub-ranges.

12. The computer memory system of claim 11, wherein said controller determines one or more subsequent voltages on said second input according to the following formula:

subsequent voltage at second input=$V_{ref(N-1)}(p_{max})(p)(LSB)$, wherein said controller determines one or more subsequent voltages on said forth input according to the following formula:

subsequent voltage at fourth input=$V_{ref(N-1)}(p_{max})(p)(LSB)$, wherein N is equal to number of comparisons, $P_{max}$ is equal to a maximum number of comparators, and $V_{ref(N-1)}(p_{max})$ is equal to a highest voltage of a previous iteration.

13. The computer memory system of claim 10, wherein said controller determines said initial voltage on said second input according to the following formula:

$$V_{ref}(1,1) = DIV\left[\frac{MSB(1)}{(m+1)\cdot LSB}\right] \cdot LSB + \frac{LSB}{2} \text{ ;}$$

wherein said controller determines said initial voltage on said forth input according to the following formula:

$$V_{ref}(1,2) = DIV\left[\frac{MSB(1)\cdot 2}{(m+1)\cdot LSB}\right] \cdot LSB + \frac{LSB}{2} \text{ ;}$$

wherein $V_{ref}(1,1)$ is equal to said initial voltage on said second reference voltage, $V_{ref}(1,2)$ is equal to said initial voltage on said fourth reference voltage, MSB(1) is equal to a maximum voltage range that can be stored in said first multi-bit memory cell, LSB is equal to said voltage sub-range, "m" is equal to said total number of comparators, and "DIV" is a divide and truncate function.

14. The computer memory system of claim 8, further comprising:
   a capacitor removably coupled to said first bit line for modifying a capacitive load on said second bit line to a value approximately equal to a capacitive load on said first bit line.

15. The computer memory system of claim 8, further comprising:
   a first switch, coupled to said first bit line and said first data line, for removably coupling said first first bit line and said first data line.

16. The computer memory system of claim 15, wherein said first switch comprises:

a first n-channel MOSFET having a drain terminal coupled to said first comparator, a source coupled to said first data line;

a first p-channel MOSFET having a drain terminal coupled to said first comparator, a source coupled to said first data line;

a second n-channel MOSFET having a drain terminal coupled to said first comparator, a source coupled to said first bit line;

a second p-channel MOSFET having a drain terminal coupled to said first comparator, a source coupled to said first bit line.

* * * * *